(12) United States Patent
Chae et al.

(10) Patent No.: US 7,198,968 B2
(45) Date of Patent: Apr. 3, 2007

(54) METHOD OF FABRICATING THIN FILM TRANSISTOR ARRAY SUBSTRATE

(75) Inventors: Gee Sung Chae, Incheon (KR); Jin Wuk Kim, Uiwang-shi (KR)

(73) Assignee: LG.Philips LCD Co., Ltd., Seoul (KR)

( * ) Notice: Subject to any disclaimer, the term of this patent is extended or adjusted under 35 U.S.C. 154(b) by 98 days.

(21) Appl. No.: 10/969,179

(22) Filed: Oct. 21, 2004

(65) Prior Publication Data
US 2005/0142714 A1 Jun. 30, 2005

(30) Foreign Application Priority Data
Dec. 27, 2003 (KR) .................. 10-2003-0098096

(51) Int. Cl.
*H01L 21/00* (2006.01)
(52) U.S. Cl. .................. 438/30; 438/197; 438/381; 257/395; 257/399; 257/703
(58) Field of Classification Search .................. 438/30, 438/142, 149, 70, 197, 238, 381, 660, 669, 438/680, 681, 706, 745
See application file for complete search history.

(56) References Cited
U.S. PATENT DOCUMENTS
6,818,923 B2 * 11/2004 Kim et al. .................. 257/72

7,001,541 B2 * 2/2006 Dhar .................. 264/1.27
2003/0197182 A1 * 10/2003 Kim et al. .................. 257/72
2003/0197187 A1 * 10/2003 Kim et al. .................. 257/83
2006/0121815 A1 * 6/2006 Kim et al. .................. 445/24

* cited by examiner

*Primary Examiner*—David Nhu
(74) *Attorney, Agent, or Firm*—Morgan, Lewis & Bockius, LLP

(57) ABSTRACT

A method of fabricating a thin film transistor array substrate is provided. The method includes forming a first conductive pattern group on a substrate using a first etch resist and a first soft mold, the first conductive pattern group including a gate electrode and a gate line; forming a gate insulating film on the substrate and the first conductive pattern group; forming a second conductive pattern group and a semiconductor pattern on the gate insulating film using a second etch resist and a second soft mold, the second conductive pattern group having a source electrode, a drain electrode, and a data line, the semiconductor pattern defining a channel region between the source electrode and the drain electrode; forming a passivation film on the gate insulating film, the second conductive pattern group and the semiconductor pattern using a third etch resist and a third soft mold, the passivation film defining a contact hole therethrough; and forming a third conductive pattern group on the passivation film using a fourth etch resist and a fourth soft mold, the third conductive pattern group having a pixel electrode.

24 Claims, 31 Drawing Sheets

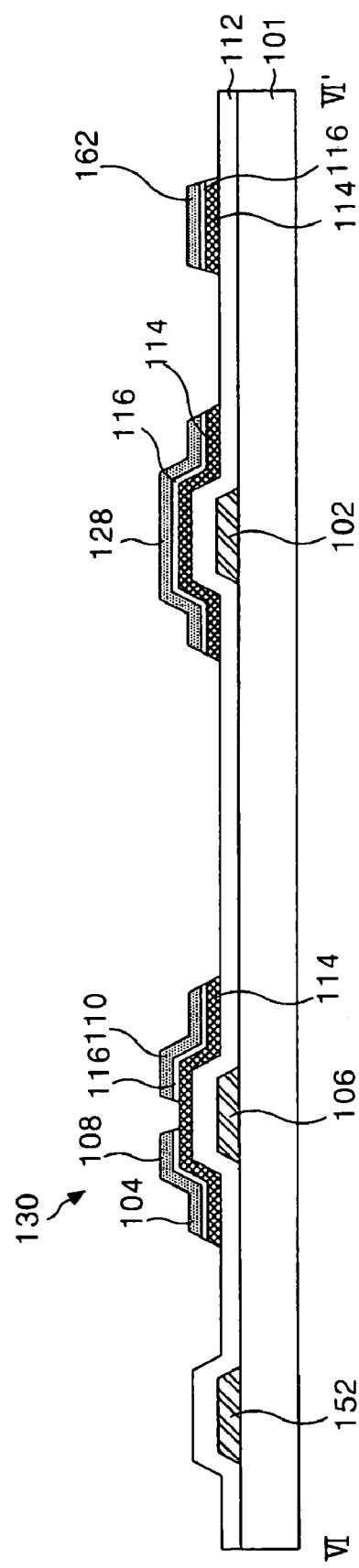

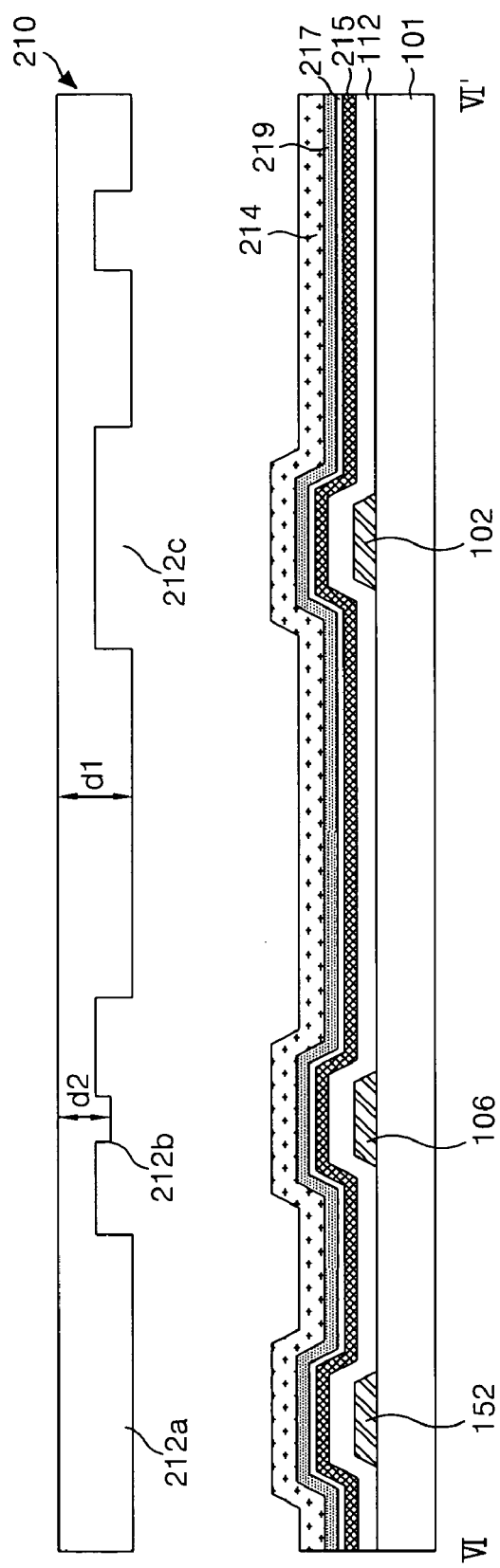

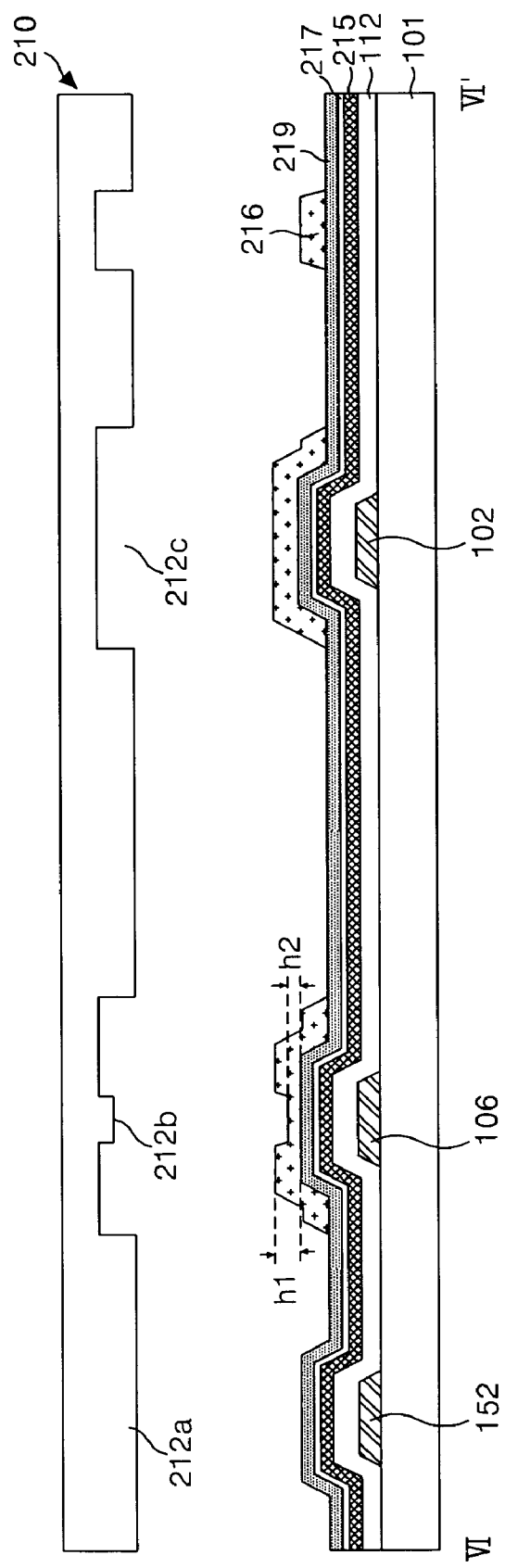

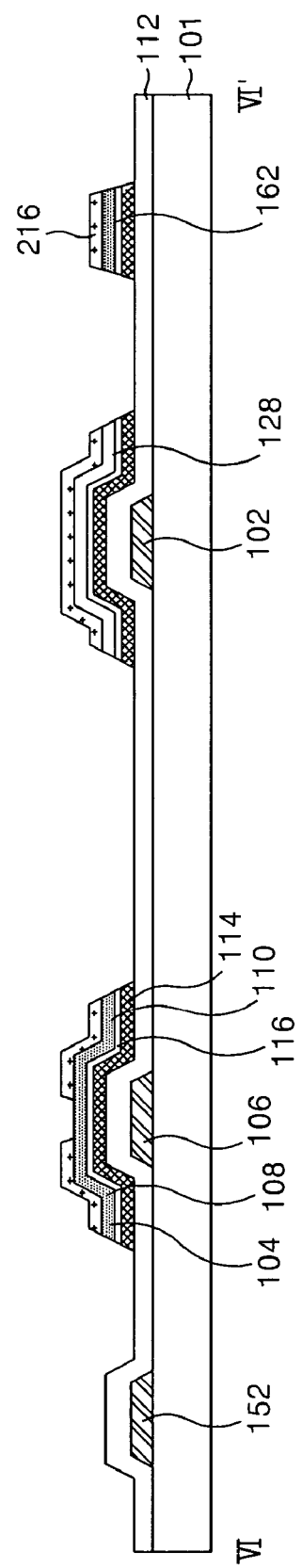

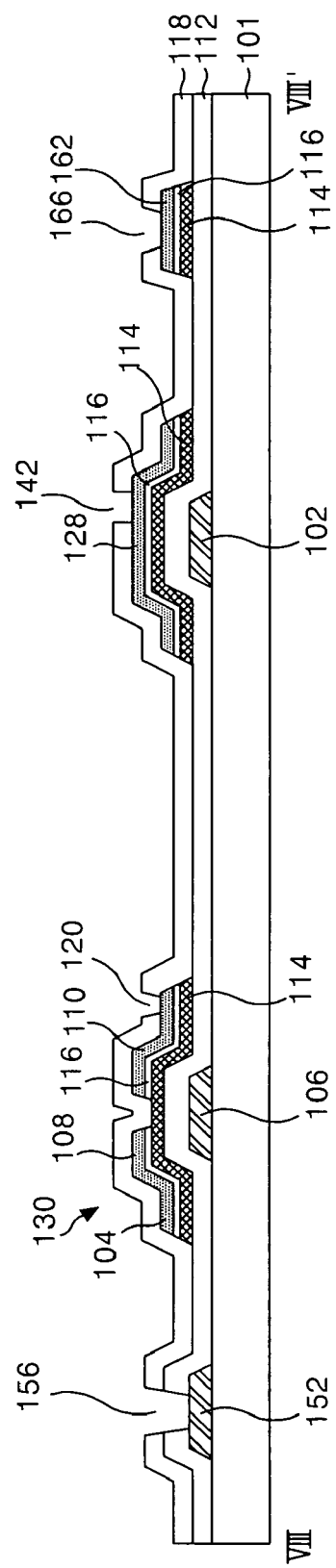

METHOD OF FABRICATING THIN FILM TRANSISTOR ARRAY SUBSTRATE

This application claims the benefit of Korean Patent Application No. P2003-98096 filed in Korea on Dec. 27, 2003, which is hereby incorporated by reference.

BACKGROUND OF THE INVENTION

1. Field of the Invention

The present invention relates to a thin film transistor array substrate, and more particularly, to a method of fabricating a thin film transistor array substrate having a patterning process.

2. Description of the Related Art

In general, liquid crystal display (LCD) devices control light transmittance of liquid crystal material using an electric field, thereby displaying a picture. The liquid crystal display device, in which a common electrode formed on an upper substrate and a pixel electrode formed on a lower substrate are arranged facing each other, drives a liquid crystal according to an electric field formed between the common electrode and the pixel electrode.

The liquid crystal display device comprises a thin film transistor array substrate (or a lower substrate) and a color filter array substrate (or an upper substrate) facing and joining each other, a spacer for uniformly maintaining a cell gap between two substrates, and liquid crystal injected into the cell gap maintained by the spacer. The thin film transistor array substrate includes a plurality of signal lines, a plurality of thin film transistors, and an alignment film for liquid crystal alignment thereon. The color filter array substrate includes a color filter for representing a color, a black matrix for preventing light leakage, and an alignment film for liquid crystal alignment thereon.

FIG. 1 is a plan view illustrating a related art thin film transistor array substrate, and FIG. 2 is a sectional view of the thin film transistor array substrate taken along line II–II' in FIG. 1.

Referring to FIGS. 1 and 2, the related art thin film transistor array substrate includes a gate line 2, a data line 4, and a gate insulating film 12 therebetween formed on a lower substrate 1 with the gate line 2 and the data line 4 intersecting each other. A thin film transistor 30 is formed at each intersection, and a pixel electrode 22 is formed in a pixel region 5 defined by the intersection. A storage capacitor 40 is formed at an overlap portion between the gate line 2 and a storage electrode 28. A gate pad 50 is connected to the gate line 2, and a data pad 60 connected to the data line 4. The gate line 2 supplying a gate signal and the data line 4 supplying a data signal are formed in an intersection structure, thereby defining the pixel region 5. The thin film transistor 30 responds to the gate signal of the gate line 2 so that the pixel signal of the data line 4 is charged to the pixel electrode 22.

To this end, the thin film transistor 30 includes a gate electrode 6 connected to the gate line 2, a source electrode 8 connected to the data line 4 and a drain electrode 10 connected to the pixel electrode 22. Further, the thin film transistor 30 includes an active layer 14 overlapping the gate electrode 6 with the gate insulating film 12 positioned between the active layer 14 and the gate electrode 6 to define a channel between the source electrode 8 and the drain electrode 10. The active layer 14 is formed overlapping the data line 4, a lower data pad electrode 62 and the storage electrode 28. On the active layer 14, an ohmic contact layer 16 for making an ohmic contact with the data line 4, the source electrode 8, the drain electrode 10, the lower data pad electrode 62 and the storage electrode 28 is further formed. The pixel electrode 22, which is connected to the drain electrode 10 of the thin film transistor 30 via a first contact hole 20 passing through a passivation film 18, is formed in the pixel region 5.

Accordingly, an electric field is formed between the pixel electrode 22 to which the pixel signal is supplied via the thin film transistor 30 and a common electrode to which the reference voltage is supplied. Moreover, the liquid crystal molecules arranged between the thin film transistor array substrate and the color filter array substrate by the electric field rotate due to a dielectric anisotropy. The light transmittance of the pixel region 5 differs in accordance with a rotation amount of the liquid crystal molecules, thereby enabling representation of pictures.

The storage capacitor 40 includes a gate line 2, a storage electrode 28 overlapping the gate line 2 with the gate insulating film 12, the active layer 14 and the ohmic contact layer 16 positioned therebetween, and a pixel electrode 22 connected to the storage electrode 28 via a second contact hole 42 formed in the passivation film 18. The storage capacitor 40 allows a pixel signal charged in the pixel electrode 22 to be stably maintained until the next pixel signal is charged.

The gate pad 50 is connected to a gate driver (not shown) and supplies a gate signal to the gate line 2. The gate pad 50 includes a lower gate pad electrode 52 extending from the gate line 2, and an upper gate pad electrode 54 connected to the lower gate pad electrode 52 using a third contact hole 56 passing through the gate insulating film 12 and the passivation film 18.

The data pad 60 is connected to a data driver (not shown) and supplies a data signal to the data line 4. The data pad 60 includes a lower data pad electrode 62 extending from the data line 4, and an upper data pad electrode 64 connected to the lower data pad electrode 62 using a fourth contact hole 66 passing through the passivation film 18.

A method of fabricating the thin film transistor substrate having the above-mentioned structure using a four mask process will be described in detail with reference to FIGS. 3A to 3H.

First, as shown in FIG. 3A, a gate metal layer 5 is formed on the upper substrate 1 by a deposition technique, such as a sputtering. A photo-resist pattern 72 is then formed by a photolithography process, such as an exposure process, using a first mask 70 defining a shielding region S2 and an exposure region S1, and a developing process. The gate metal layer 5 is patterned by an etching process using the photo-resist pattern 72, thereby forming a first conductive pattern group including the gate line 2, the gate electrode 6, and the lower gate pad electrode 52 on the lower substrate 1, as shown in FIG. 3B.

The gate insulating film 12, an amorphous silicon layer 15, an n$^+$amorphous silicon layer 17, and a data metal layer 19 are sequentially formed on the lower substrate 1 provided with the first conductive pattern group by deposition techniques, such as the plasma enhanced chemical vapor deposition (PECVD) and the sputtering, etc, as shown in FIG. 3C.

Then, a photo-resist pattern 76 is formed by a photolithography process including an exposure process using a second mask 74 defining an exposure region S1, a shielding region S2 and a partial exposure region S3, and a developing process. In this case, a diffractive exposure mask having a diffractive exposing portion at a channel portion of the thin film transistor is used as a second mask 74, thereby allowing the photo-resist pattern 76 of the channel portion to have a lower height than photo-resist patterns of other regions. Subsequently, a data metal layer 19 is then patterned by a wet etching process using the photo-resist pattern 76, thereby forming a second conductive pattern group including the data line 4, the source electrode 8, the drain electrode 10 being integral to the source electrode 8 and the storage electrode 28, as shown in FIG. 3D. Next, the amorphous silicon layer and the $n^+$ amorphous silicon layer are patterned at the same time by a dry etching process using the same photo-resist pattern, thereby forming the ohmic contact layer 16 and the active layer 14. The photo-resist pattern having a relatively low height is removed from the channel portion by ashing, and thereafter, the data metal layer and the ohmic contact layer 16 of the channel portion are etched by the dry etching process. Thus, the active layer 16 of the channel portion is exposed so that the source electrode 8 is separated from the drain electrode 10.

The passivation film 18 is entirely formed on the gate insulating film 12 provided with the second conductive pattern group by a deposition technique, such as plasma enhanced chemical vapor deposition (PECVD), as shown in FIG. 3E. Then, a photo-resist pattern 80 is formed by a photolithography process including an exposure process using a third mask 78 defining a shielding region S2 and an exposure region S1, and a developing process, on the passivation film 18. The passivation film 18 is patterned by etching using the photo-resist pattern 80, thereby forming first to fourth contact holes 20, 42, 56 and 66, as shown in FIG. 3F.

As shown in FIG. 3G, a transparent conductive film 23 is coated onto the passivation film 18 having the first to the fourth contact holes 20, 42, 56 and 66 by a deposition technique, such as the sputtering, etc. Then, a photo-resist pattern 84 is formed by a photolithography process including an exposure process using a fourth mask 82 defining a shielding region S2 and an exposure region S1, and a developing process. The transparent conductive film 23 is patterned by etching using the photo-resist pattern, thereby forming a third conductive pattern group including the pixel electrode 22, the upper gate pad electrode 54 and the upper data pad electrode 64.

As described above, in the thin film transistor array substrate and the method of fabricating the same, the photolithograph process includes a series of photo processes such as a coating process of a photo-resist, a mask arranging process, an exposing process, a developing process, and a stripping process. Here, the photolithography process requires a long processing time, a waste of a stripping solution for removing a photo-resist pattern and a photo-resist, and expensive equipment such as an exposure equipment. As a result, as substrate size becomes large and pattern size becomes small, exposing equipment becomes increasingly expensive accordingly.

SUMMARY OF THE INVENTION

Accordingly, the present invention is directed to a method of fabrication thin film transistor array substrate that substantially obviates one or more of the problems due to limitations and disadvantages of the related art.

Accordingly, it is an object of the present invention to provide a method of fabricating a thin film transistor array substrate capable of performing a patterning process without a photo process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of fabricating the thin film transistor array substrate according to the present invention a method of fabricating a thin film transistor array substrate comprises forming a first conductive pattern group on a substrate using a first etch resist and a first soft mold, the first conductive pattern group including a gate electrode and a gate line; forming a gate insulating film on the substrate and the first conductive pattern group; forming a second conductive pattern group and a semiconductor pattern on the gate insulating film using a second etch resist and a second soft mold, the second conductive pattern group including a source electrode, a drain electrode, and a data line, the semiconductor pattern defining a channel region between the source electrode and the drain electrode; forming a passivation film on the gate insulating film, the second conductive pattern group and the semiconductor pattern using a third etch resist and a third soft mold, the passivation film defining a contact hole therethrough; and forming a third conductive pattern group on the passivation film using a fourth etch resist and a fourth soft mold, the third conductive pattern group including a pixel electrode.

In another aspect, a method of fabricating a thin film transistor array substrate comprises forming at least one thin film of a conductive layer, a semiconductor layer, and an insulating layer on a substrate; forming an etch resist on the at least one thin film; pressure contacting a soft mold onto the etch resist and, at the same time, heating the substrate to form an etch resist pattern; separating the soft mold from the etch resist pattern; and etching the thin film using the etch resist pattern as a mask to form at least one of a conductive pattern, a semiconductor pattern, and an insulating pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 6A and 6B are respectively a plan view and a sectional view illustrating a semiconductor pattern and a second conductive pattern group formed by a second soft mold process in the method of fabricating an exemplary thin film transistor array substrate according to the present invention;

FIGS. 7A and 7D are sectional views explaining the second soft mold process in the method of fabricating the exemplary thin film transistor array substrate according to the present invention;

DETAILED DESCRIPTION OF THE PREFERRED EMBODIMENTS

Reference will now be made in detail to the preferred embodiments of the present invention, examples of which are illustrated in the accompanying drawings.

Hereinafter, the preferred embodiments of the present invention will be described in detail with reference to FIGS. 4A to 11C.

Figure 1:
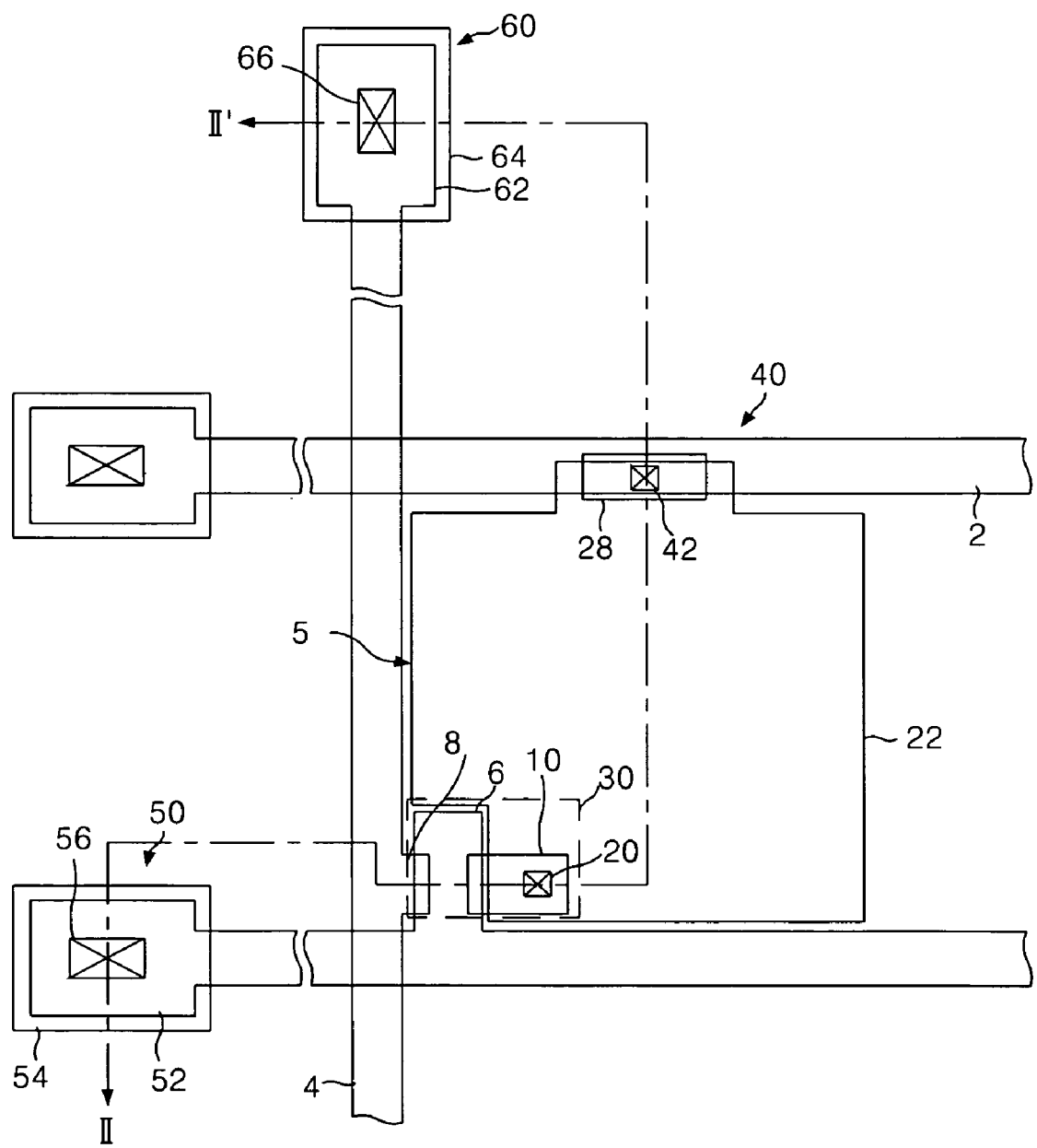
FIG. 1 is a plan view illustrating a related art thin film transistor array substrate.
Figure 2:
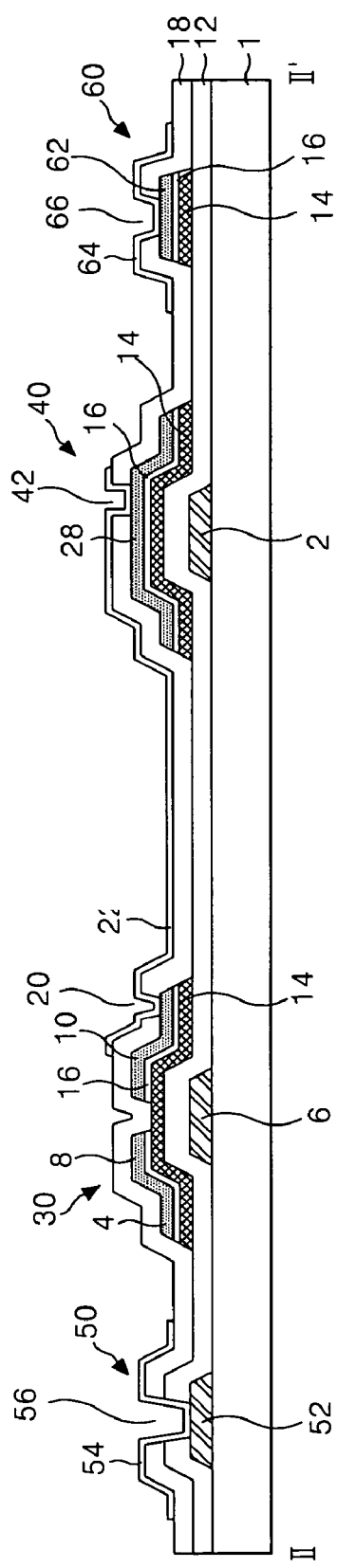
FIG. 2 is a sectional view illustrating the thin film transistor array substrate taken along line II–II' in FIG. 1.
Figure 3A:
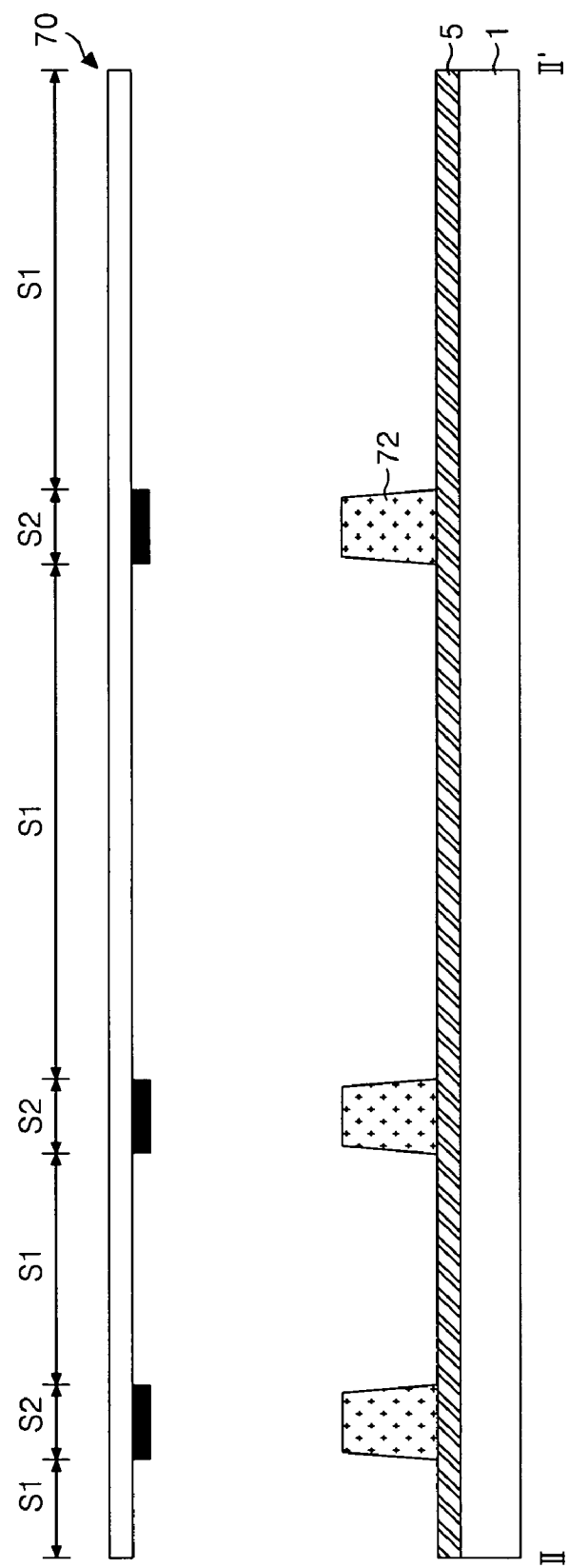
FIGS. 3A to 3H are sectional views sequentially illustrating a method of manufacturing the thin film transistor array substrate shown in FIG. 2.
Figure 3B:
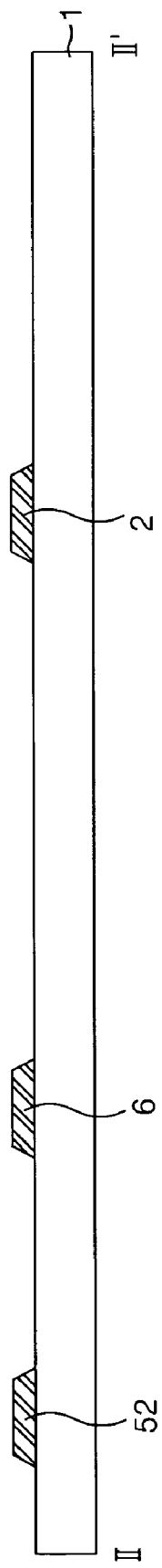
Figure 3C:
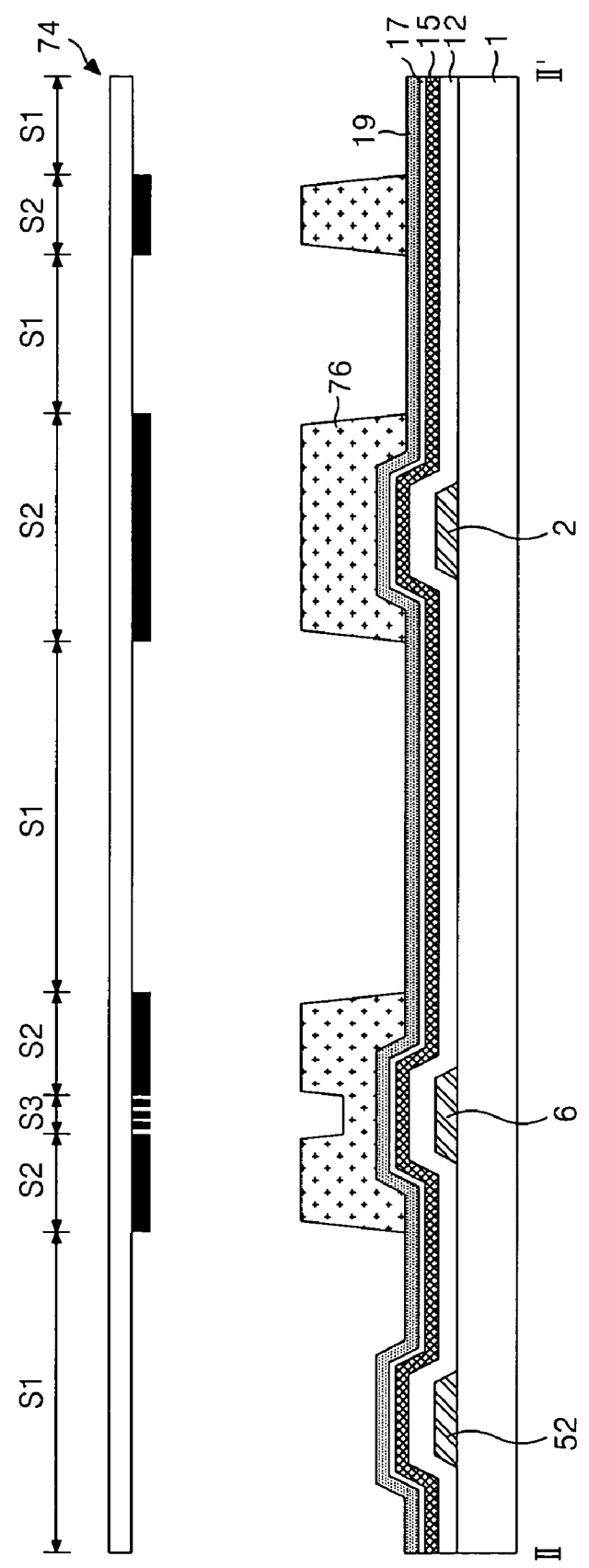
Figure 3D:
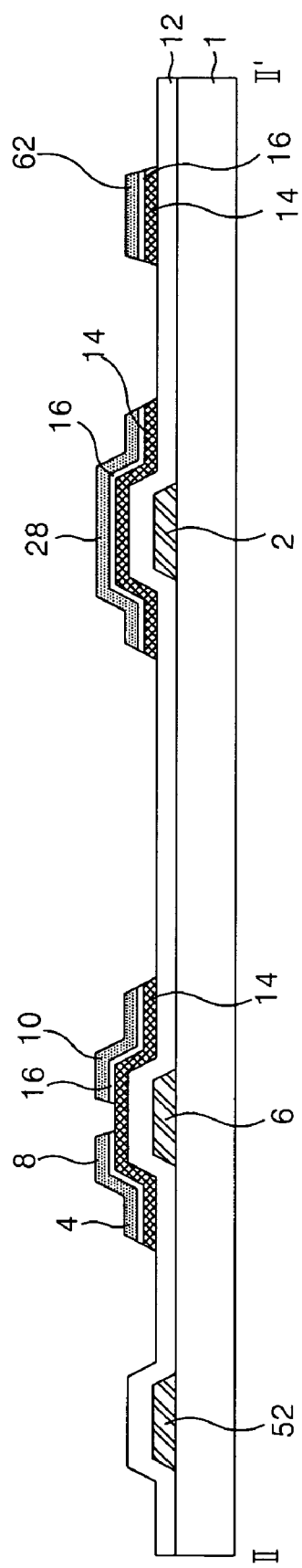
Figure 3E:
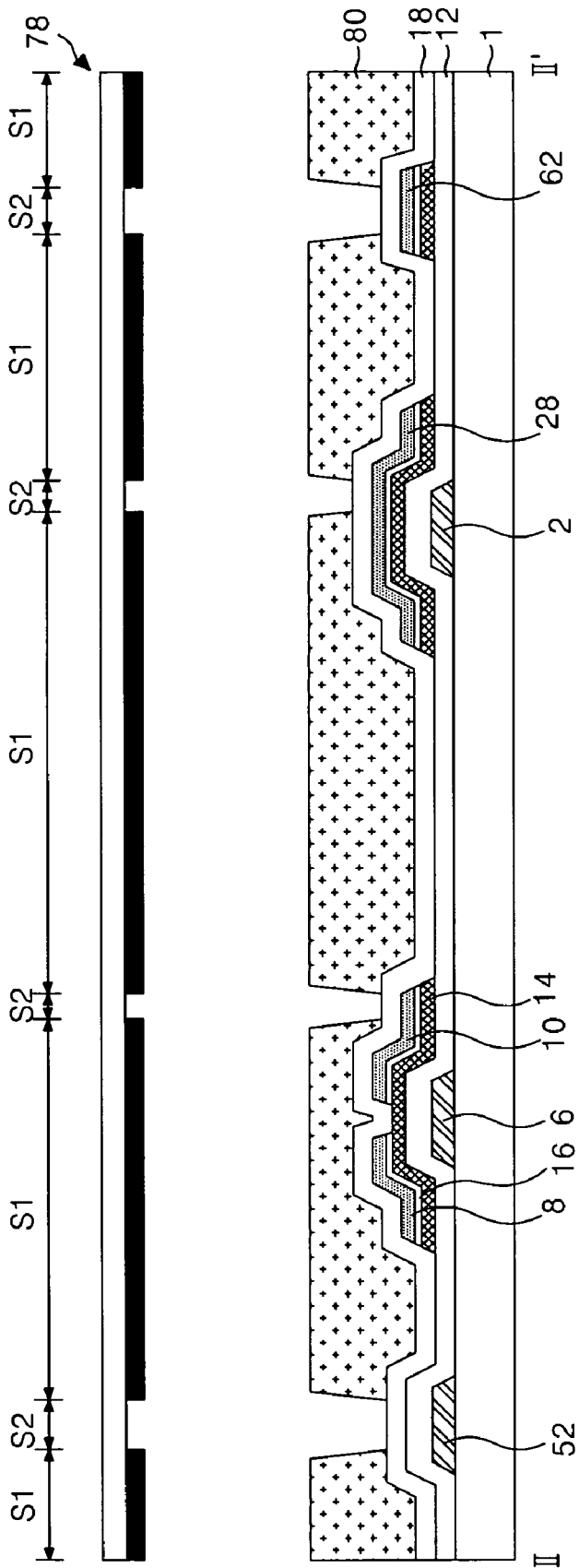
Figure 3F:
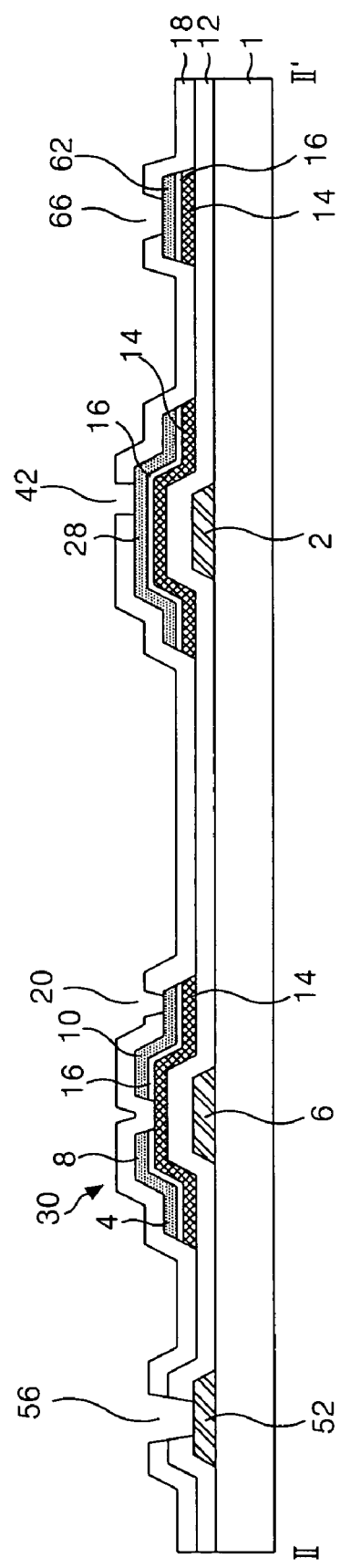
Figure 3G:
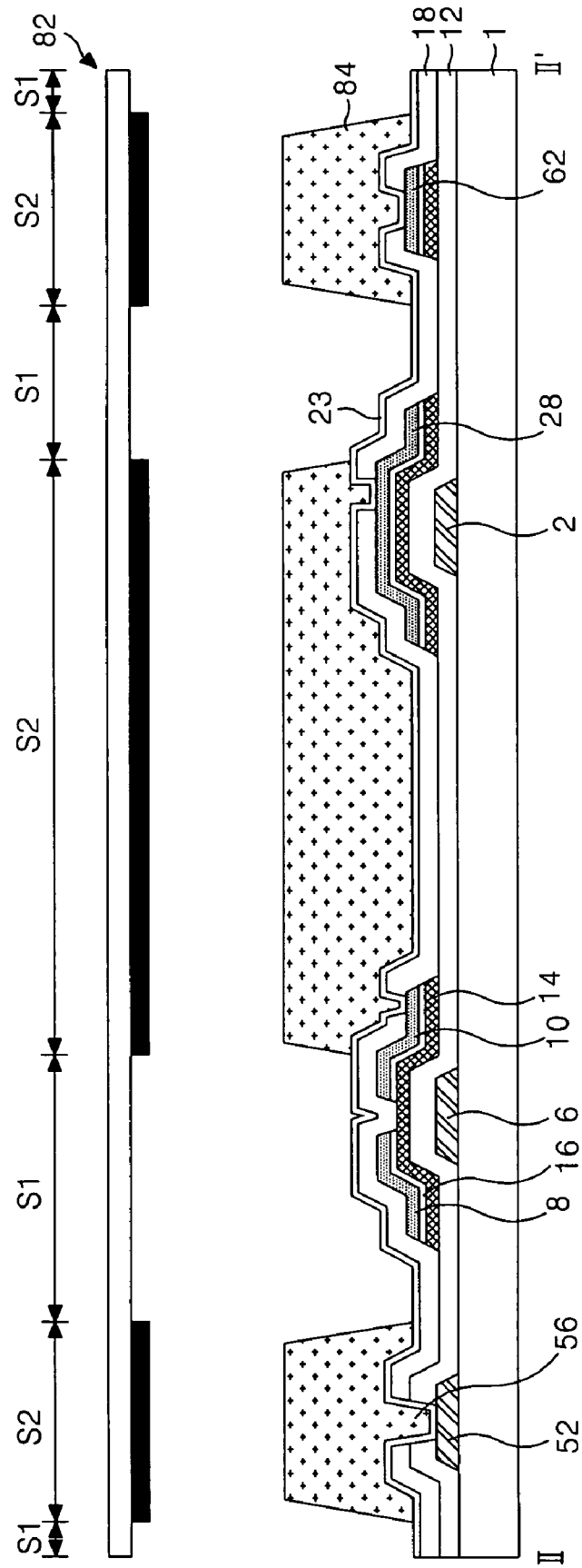
Figure 3H:
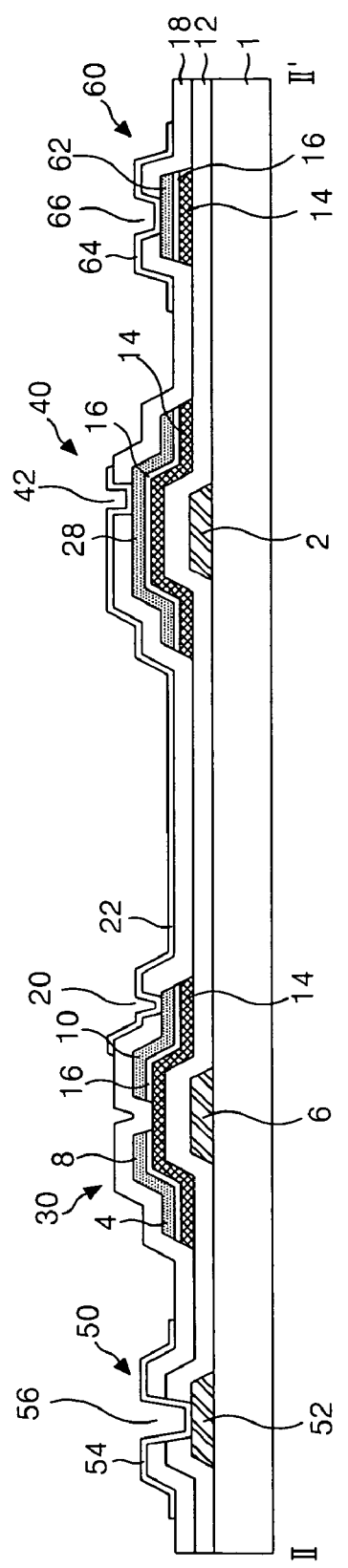
Figure 4A:
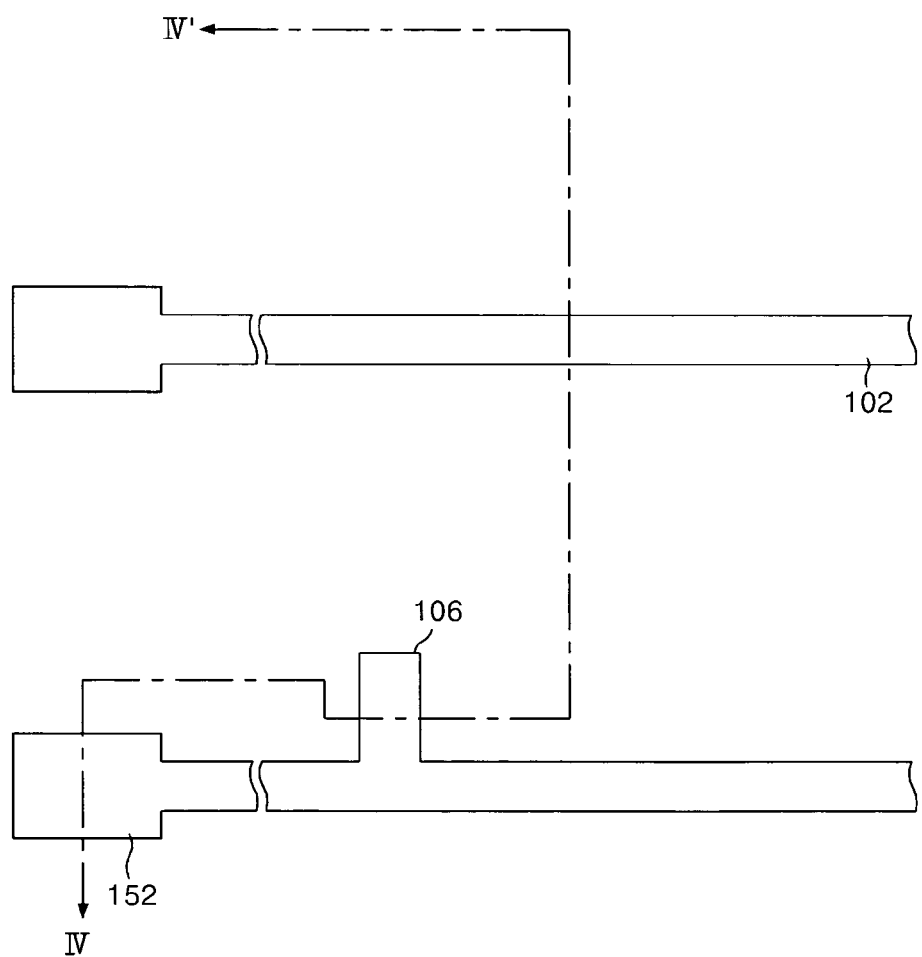
FIGS. 4A and 4B are a plan view and a sectional view illustrating first conductive pattern group formed by a first soft mold process in a method of fabricating an exemplary thin film transistor array substrate according to the present invention.
Figure 4B:
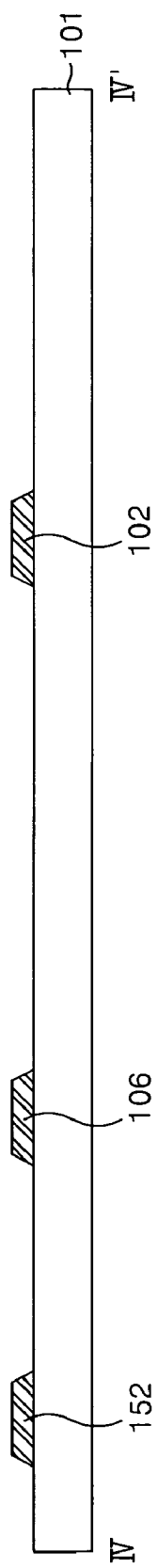
Figure 5A:
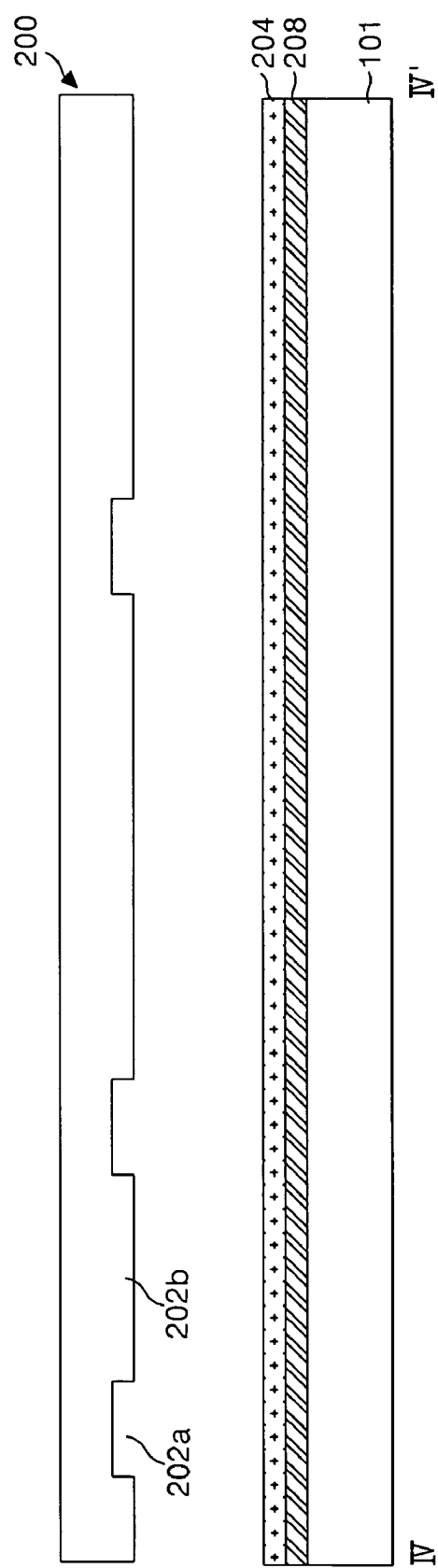
FIGS. 5A and 5C are sectional views explaining the first soft mold process in the method of fabricating the exemplary thin film transistor array substrate according to the present invention.

FIGS. 4A and 4B are a plan view and a sectional view illustrating a first conductive pattern group formed by a first soft mold process in a method of fabricating a thin film transistor array substrate according to the present invention, respectively;

As shown in FIGS. 4A and 4B, a first conductive pattern including a gate line 102 supplying a gate signal, a gate electrode 106 connected to the gate line and a lower gate pad electrode 152 extending from the gate line is formed on a lower substrate 101. The gate line 102 supplies the gate signal from the lower gate pad electrode 152 to the gate electrode 106. To form the first conductive pattern group, a gate metal layer 208 is formed by a deposition technique, such as a sputtering, on the lower substrate 101 and an etch resist solution 204 is formed on the gate metal layer by a coating process, such as a nozzle spray or a spin coating, as shown in FIG. 5A. Herein, the gate metal layer 208 includes a metal, such as an aluminum (Al) system having an aluminum/neodium alloy (AlNd), molybdenum (Mo), copper (Cu), chrome (Cr), tantalum (Ta), or titanium (Ti). Of course, other materials can be used as desired. The etch resist solution 204 includes a substance having a heat-resistance and a chemical-resistance, for example, a solution such as an ethanol solution having a novolac resin of about 5 weight % to 30 weight % added thereto.

Subsequently, a first soft mold 200 having a groove 202a and a protrusion 202b is arranged on an upper portion of the etch resist solution 204. The groove 202a of the first soft mold corresponds to an area in which the first conductive pattern group will be formed. The first soft mold 200 includes a rubber with a large elasticity, for example, a polydimethylsiloxane (PDMS), a polyurethane and a cross-linked novolac resin.

Figure 5B:
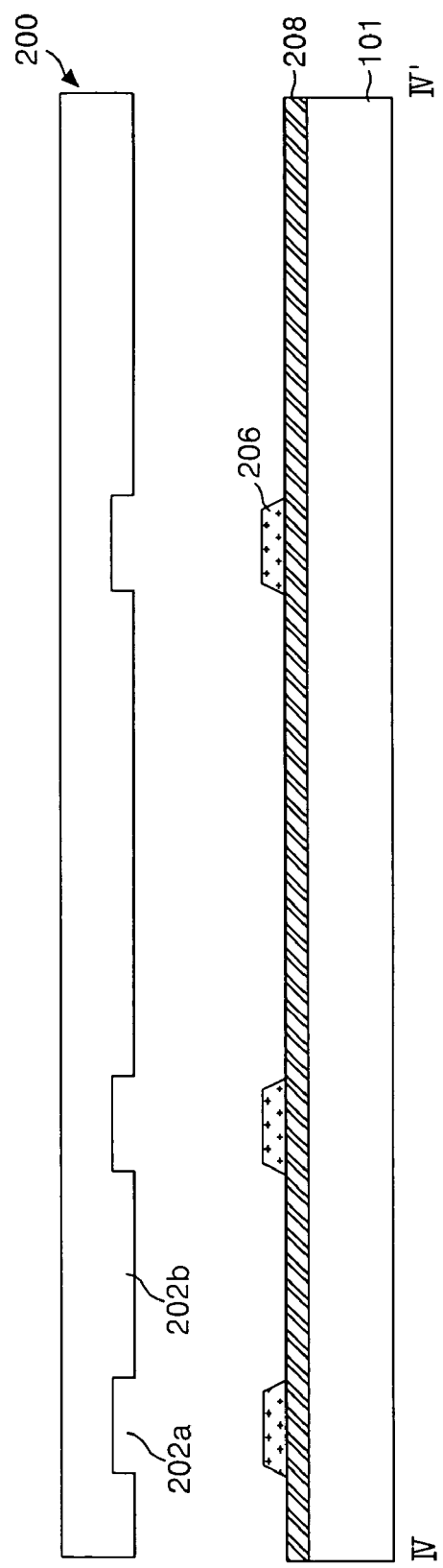

The etch resist solution 204 is pressurized by the first soft mold 200 with a load weight during a designated time, e.g., about 10 minutes to 2 hours, so that a surface of a protrusion 202b of the first soft mode 200 is contacted with the gate metal layer 208. At this time, the substrate 101 is baked at about or less than 130° C. Then, the etch resist solution 204 moves into the groove 202a of the first soft mold by a capillary force generated by a pressure between the first soft mold 200 and the substrate 101, and a repulsive power generated between the first soft mold 200 and the etch resist solution 204. As a result, the groove 202a of the first soft mold 200 and an inversely transferred etch resist pattern 206 are formed as shown in FIG. 5B.

Figure 5C:
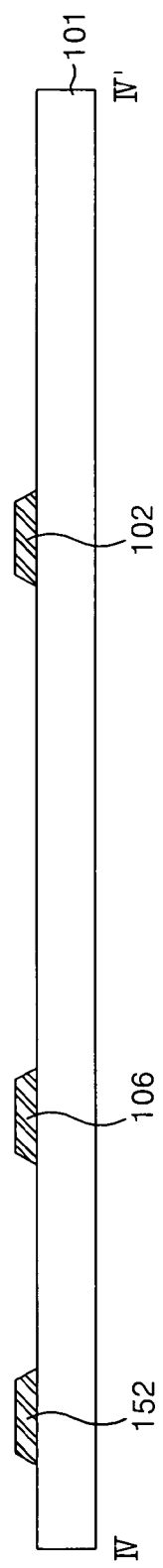

Thereafter, the first soft mold 200 is separated from the substrate 101, and then the gate metal layer 208 is patterned by an etching process using the etch resist pattern 206 as a mask. Accordingly, a first conductive pattern group including a gate line 102, a gate electrode 106 and a lower gate pad electrode 152 is formed, as shown in FIG. 5C. Further, a remainder of the etch resist pattern 206 left on the first conductive pattern group is removed by a stripping process using a striper liquid, preferably, of an environmentally friendly alcohol system.

Figure 6A:
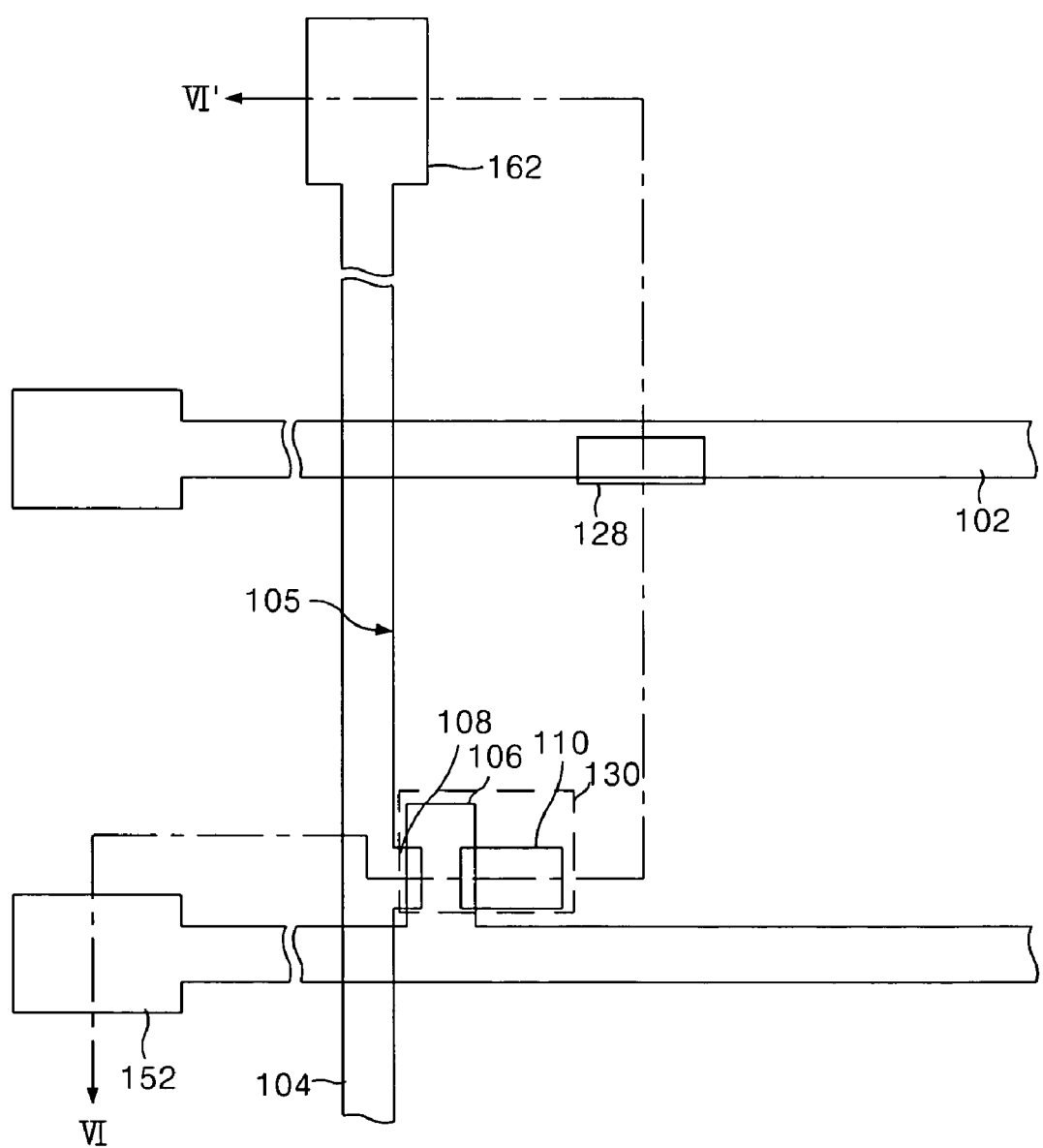

FIGS. 6A and 6B are a plan view and a sectional view illustrating a second soft mold process in a method of fabricating a thin film transistor array substrate according to the present invention.

A second conductive pattern group—including a semiconductor pattern having an active layer 114 stacked on a gate insulating film 112 and an ohmic contact layer 116, a data line 104, a source electrode 108 connected to the data line 104, a drain electrode 110 facing to the source electrode 108 with a channel positioned therebetween, a lower data pad electrode 162 extending from the data line 104, and a storage electrode 128 organizing a storage capacitor—is formed, as shown in FIGS. 6A and 6B. Herein, the semiconductor patterns 114 and 116 form a channel between the source electrode 108 and the drain electrode 110 to define a thin film transistor (TFT) 130. The data line 104 supplies a data signal from the lower data pad electrode 162 to the source electrode 108 and crosses the gate line 102 to define the pixel region 105 shown in FIG. 6A.

To form the semiconductor pattern and the second conductive pattern group, the gate insulating film 112, a first semiconductor layer 215, a second semiconductor layer 217, and a data metal layer 219 are sequentially formed by deposition techniques, such as a plasma enhanced chemical vapor deposition (PECVD) method and a sputtering method, on the lower substrate 101 provided with the first conductive pattern group, as shown in FIG. 7A. Herein, the gate insulating film 112 is made of an inorganic insulating material, such as a silicon oxide $SiO_x$ and a silicon nitride $SiN_x$, the first semiconductor layer 215 is made of an amorphous silicon that an impurity is not doped, and the second seminconductor layer 217 is made of amorphous silicon that an impurity of a N-type or P-type is doped. The data metal layer 219 is made of a metal, such as an aluminum (Al) system, molybdenum (Mo) and copper (Cu).

Thereafter, an etch resist solution 214 is coated by a coating process such as a nozzle spray and a spin coating to the data metal layer 219, as shown in FIG. 7A. A soft mold 210, preferably having a material identical to the first soft mold, is arranged on the etch resist solution 214. The second soft mold 210 includes a first protrusion 212a and a second protrusion 212b having heights d1 and d2 different each other, and a groove 212c formed between the first protrusion 212a and the second protrusion 212b and between the first protrusions 212a. Herein, the protrusion 212b is formed at an area corresponding to a channel portion of the thin film transistor 130 shown in FIGS. 6A and 6B, and the groove 212a is correspondingly formed at an area in which the second conductive pattern group will be formed.

The etch resist solution 214 is pressurized by the second soft mold 210 with a load weight during a designated time, for example, about 10 minutes to 2 hours, by of the second soft mold, so that a surface of a protrusion 212b of the second soft mode 210 is contacted with the data metal layer 219. At this time, the substrate 101 is baked at about or less than 130° C. Then, the etch resist solution 214 moves into the groove 212c of the second soft mold 210 by a capillary force, generated by a pressure between the second soft mold 210 and the substrate 101, and a repulsive power, generated between the second soft mold 210 and the etch resist solution 214. As a result, the groove 212c of the second soft mold 210 and an inversely transferred etch resist pattern 216 with a stepped part are formed as shown in FIG. 7B. In other words, the etch resist pattern 216, formed at an area corresponding to the second protrusion 212b, has a second height h2 lower than a first height h1 of the etch resist pattern 126, formed at an area corresponding to the groove 212c.

Thereafter, the second soft mold 210 is separated from the substrate 101, and then the data metal layer is patterned by a wet-etching process using the etch resist pattern 216 as a mask. Accordingly, a second conductive pattern group including the storage electrode 128, the data line 104, the source electrode 108 and the drain electrode 110 connected to the data line 104, and the lower data pad electrode 162 extending from the data line 104, is formed, as shown in FIG. 7C. Herein, the data line 104 is formed crossing the gate line 102 to define the pixel region 105 of FIG. 6A as described above.

Subsequently, the first and the second semiconductor layers 215 and 217 are patterned by a dry-etching process using the etch resist pattern 216 as a mask. Accordingly, the active layer 114 and the ohmic contact layer 116 are formed along the second conductive pattern group.

Figure 7D:
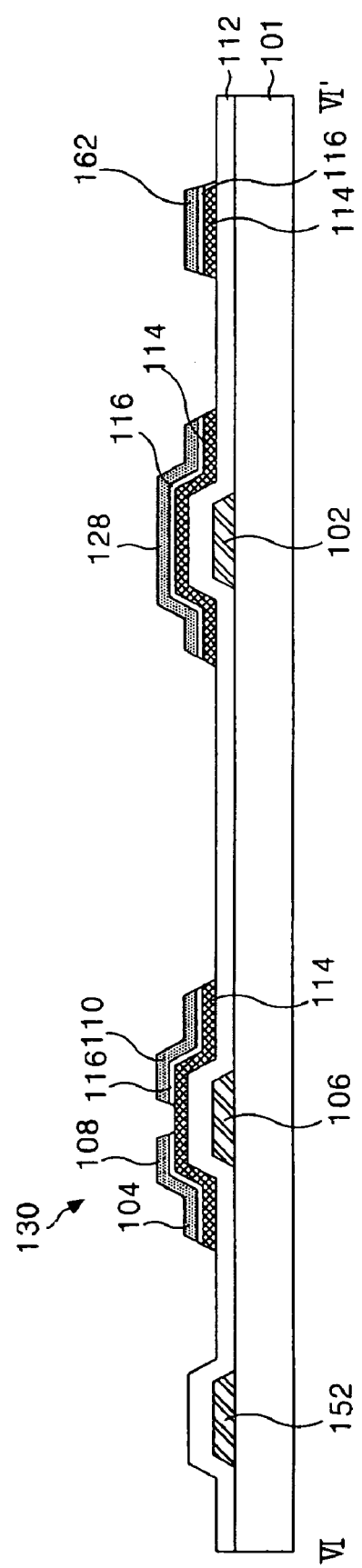

Next, the etch resist pattern 216 with the second height h2 is removed by an ashing process using an oxygen ($O_2$) plasma, whereby the etch resist pattern 216 with the first height hi becomes about as low as the second height h2. That is, the resist pattern 216 has a lower height than the first height h1 by the second height h2. The data metal layer and the ohmic contact layer 116 formed at a channel portion of the thin film transistor are removed by etching process using the etch resist pattern 216 and therefore, the drain electrode 110 is separated from the source electrode 108, as shown in FIG. 7D. Further, a remainder of the etch resist pattern 216 left on the second conductive pattern group is removed by a stripping process using a striper liquid, preferably, of an environmentally friendly alcohol system.

Figure 8A:
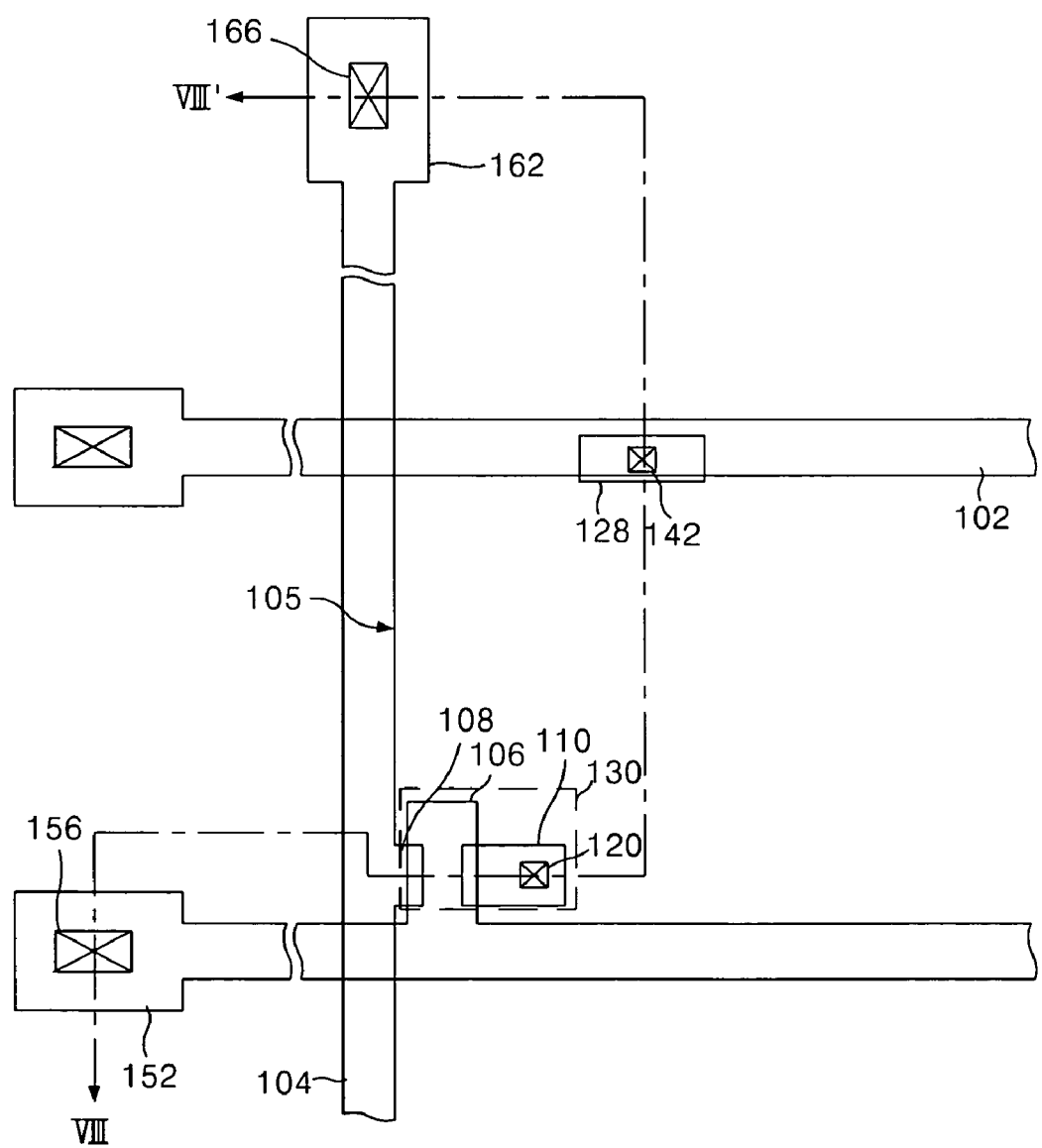
FIGS. 8A and 8B are respectively a plan view and a sectional view illustrating a passivation film having a contact hole formed by a third soft mold process in the method of fabricating an exemplary thin film transistor array substrate according to the present invention.
Figure 8B:
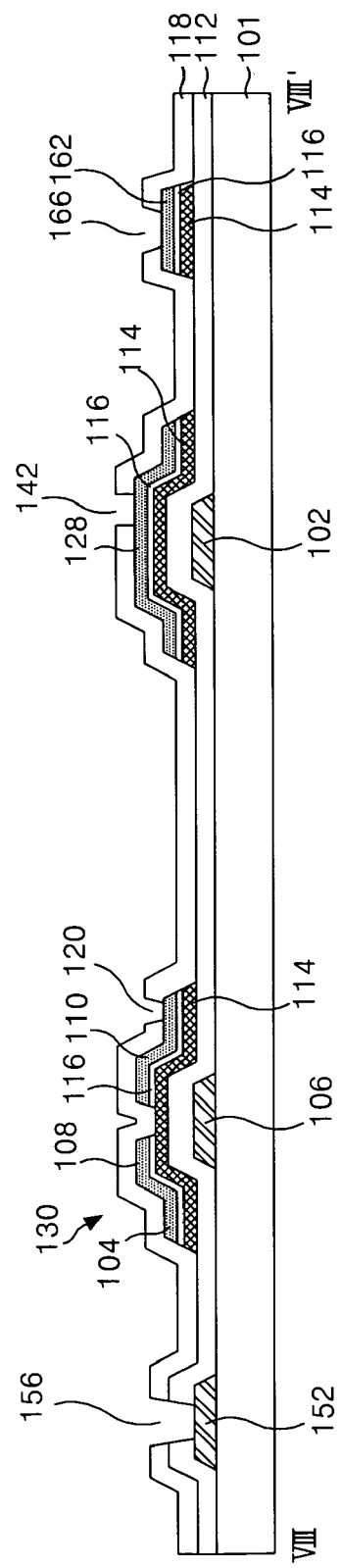

FIGS. 8A and 8B are respectively a plan view and a sectional view illustrating a third soft mold process in a method of fabricating a thin film transistor array substrate according to the present invention.

Figure 9A:
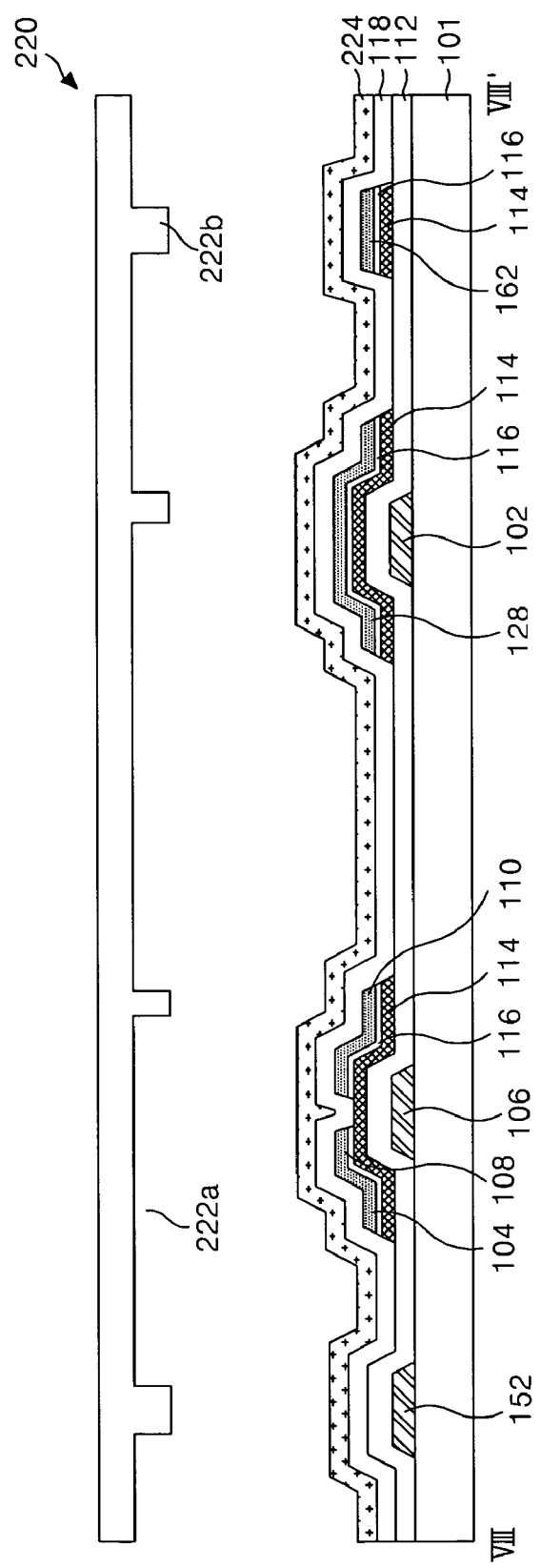
FIGS. 9A and 9C are sectional views explaining the third soft mold process in the method of fabricating the exemplary thin film transistor array substrate according to the present invention.

A passivation film 118 including first to fourth contact holes 120, 142, 156 and 166 is formed on the gate insulating film 112 provided with the second conductive pattern group, as shown in FIGS. 8A to 8B. To form the passivation film 118 including the first to the fourth contact holes 120, 142, 156 and 166, the passivation film 118 is formed on the gate insulating film 112 by a deposition technique, such as a plasma enhanced chemical vapor deposition (PECVD), and an etch resist solution 224 is formed by a coating process, such as a nozzle spray and a spin coating, on the passivation film 118, as shown in FIG. 9A. Herein, the passivation film 118 includes an inorganic insulating material, such as the gate insulating film 112, or an organic insulating material having a small dielectric constant, such as an acrylic organic compound, BCB (benzocyclobutene) or PFCB (perfluorocyclobutane) and the like. The etch resist solution 224 includes a substance having a heat-resistance and a chemical-resistance, for example, an ethanol solution having a novolac resin of about 5 weight % to 30 weight % added thereto.

Figure 9B:
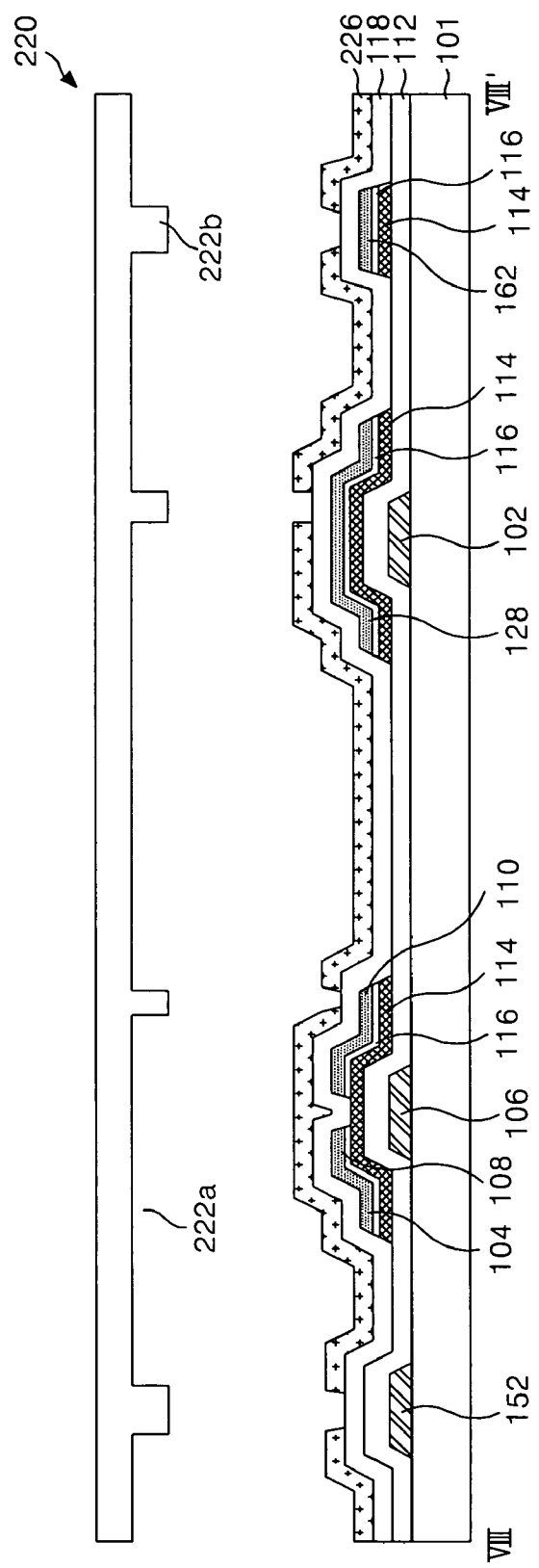

Subsequently, a third soft mold 220 having a groove 222a and a protrusion 222b is arranged on an upper portion of the etch resist solution 224. The protrusion 222b of the third soft mold 220 corresponds to an area in which the first to the fourth contact holes will be formed. The etch resist solution 224 is pressurized by the third soft mold 220 with a load weight during a designated time, for example, about 10 minutes to 2 hours, by the third soft mold so that a surface of the protrusion 222b of the third soft mode 220 contacts the passivation film 118. At this time, the substrate 101 is baked at about or less than 130° C. Then, the etch resist solution 224 moves into the groove 222a of the third soft mold 220 by a capillary force generated by a pressure between the third soft mold 220 and the substrate 101 and by a repulsive power generated between the third soft mold 220 and the etch resist solution 224. As a result, the groove 222a of the third soft mold 220 and an inversely transferred etch resist pattern 226 are formed as shown in FIG. 9B.

Thereafter, the third soft mold 220 is separated from the substrate 101, and then the passivation film 118 is patterned by an etching process using the etch resist pattern 226 as a mask. Accordingly, the first to the fourth contact holes 120, 142, 156 and 166 are formed, as shown in FIG. 9C. The first contact hole 120 passes through the passivation film 118 to expose the drain electrode 110 of the thin film transistor. The second contact hole 142 passes through the passivation film to expose the storage electrode 128. The third contact hole 156 passes through the passivation film 118 and the gate insulating film 112 to expose the lower gate pad electrode 152. The fourth contact hole 166 passes through the passivation film 118 to expose the lower data pad electrode 162. Further, a remainder of the etch resist pattern 226 left on the passivation film 118 is removed by a stripping process using a striper liquid, preferably of an environmentally friendly alcohol system.

Figure 10A:
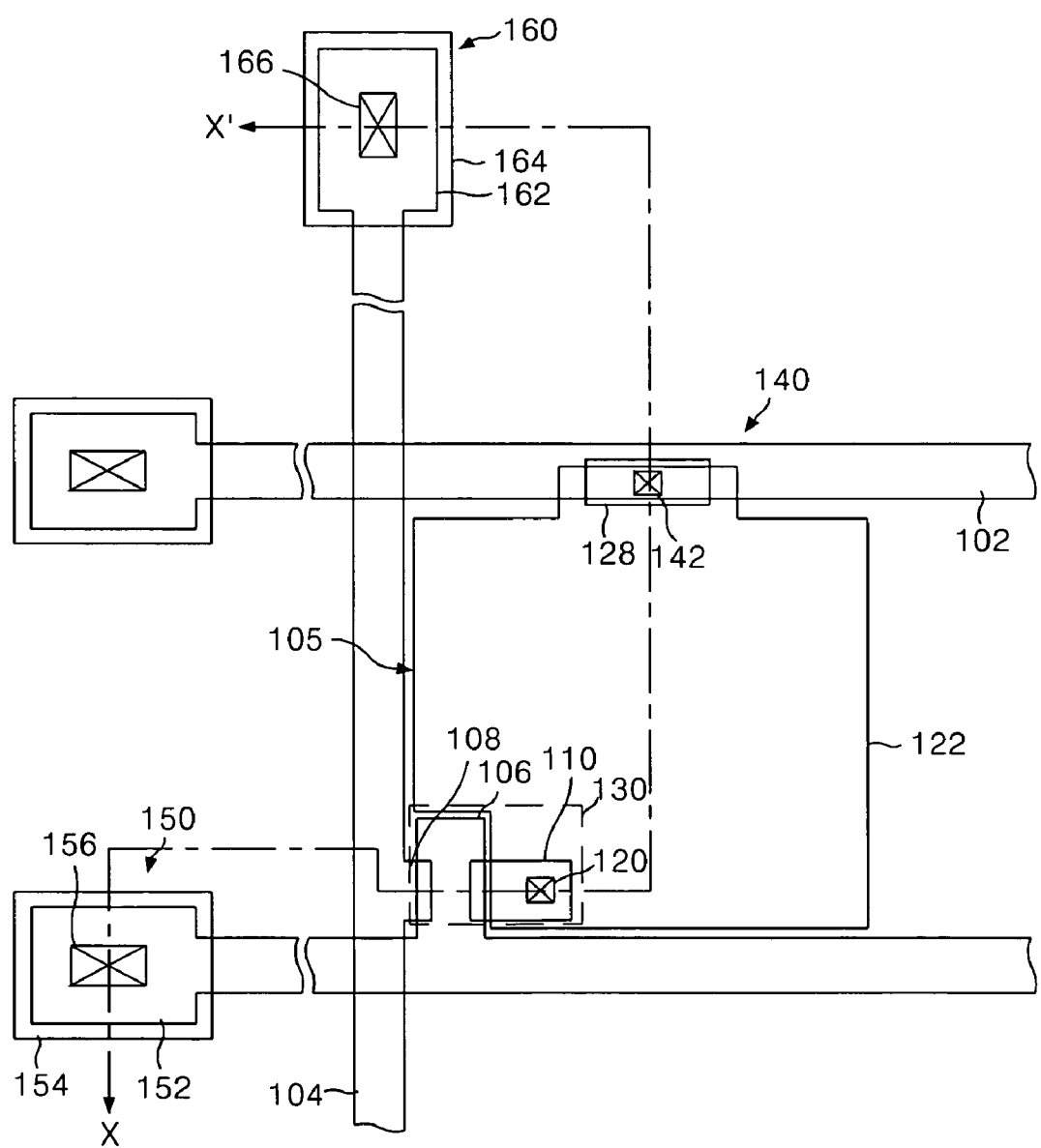
FIGS. 10A and 10B are respectively a plan view and a sectional view illustrating a third conductive pattern group formed by a fourth soft mold process in the method of fabricating an exemplary thin film transistor array substrate according to the present invention.
Figure 10B:
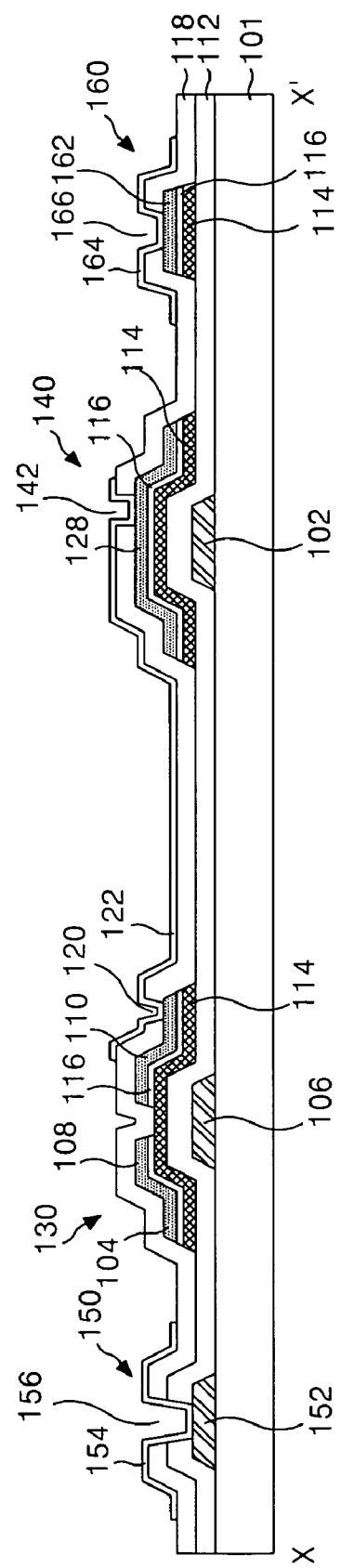

FIGS. 10A and 10B are a plan view and a sectional view illustrating a fourth soft mold process in a method of fabricating a thin film transistor array substrate according to the present invention.

As shown in FIGS. 10A and 10B, a third conductive pattern group including a pixel electrode 122, an upper gate pad electrode 154 and an upper data pad electrode 164 is formed on the passivation film 118. Herein, the pixel electrode 122 is connected to the drain electrode 110 of the thin film transistor 130 via the first contact hole 120 to form the pixel region 105. Also, the pixel electrode 122 is connected to the storage electrode via the second contact hole 142 to form a storage capacitor 140. That is, the storage capacitor 140 includes the gate line 102, the storage electrode 128 overlapping the gate line 102 with the gate insulating film 112, the active 114 and the ohmic contact layer 116 positioned therebetween, and the pixel electrode 122 connected to the storage electrode 128 via the second contact hole 142 formed on the passivation film 118. The storage capacitor 140 allows a pixel signal charged in the pixel electrode 122 to be stably maintained until the next pixel signal is charged. The upper gate pad electrode 154 is connected to the lower gate pad electrode 152 via the third contact hole 156 to organize a gate pad 150. The gate pad 150 is connected to a gate driver (not shown) and supplies a gate signal provided from the gate driver to the gate line 102. The upper data pad electrode 164 is connected to the lower data pad electrode 162 via the fourth contact hole 166 to form a data pad 160. The data pad 160 is connected to a data driver (not shown) and supplies a data signal provided from the data driver to the data line 104.

Figure 11A:
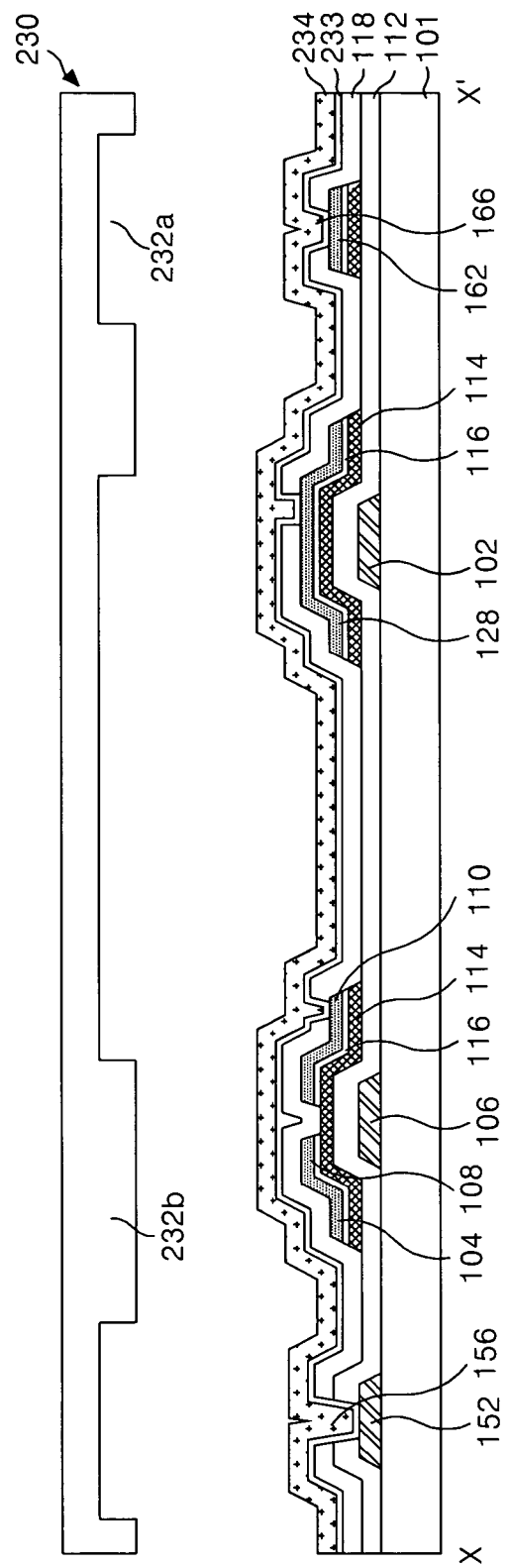
FIGS. 11A and 11C are sectional views explaining the fourth soft mold process in the method of fabricating the exemplary thin film transistor array substrate according to the present invention.

To form the third conductive pattern group, a transparent conductive film 233 is formed by a deposition technique, such as a sputtering, on the passivation film 118 and an etch resist solution 234 is formed by a coating process, such as a nozzle spray or a spin coating, on the transparent conductive film 233, as shown in FIG. 11A. In this connection, the transparent conductive film 233 may be made of an indium-tin-oxide (ITO), a tin-oxide (TO), an indium-zinc-oxide (IZO), an indium-tin-zinc-oxide (ITZO) or other suitable material. The etch resist solution 234 includes a substance having a heat-resistance and a chemical-resistance, for example, an ethanol solution having a novolac resin of about 5 weight % to 30 weight % added thereto.

Figure 11B:
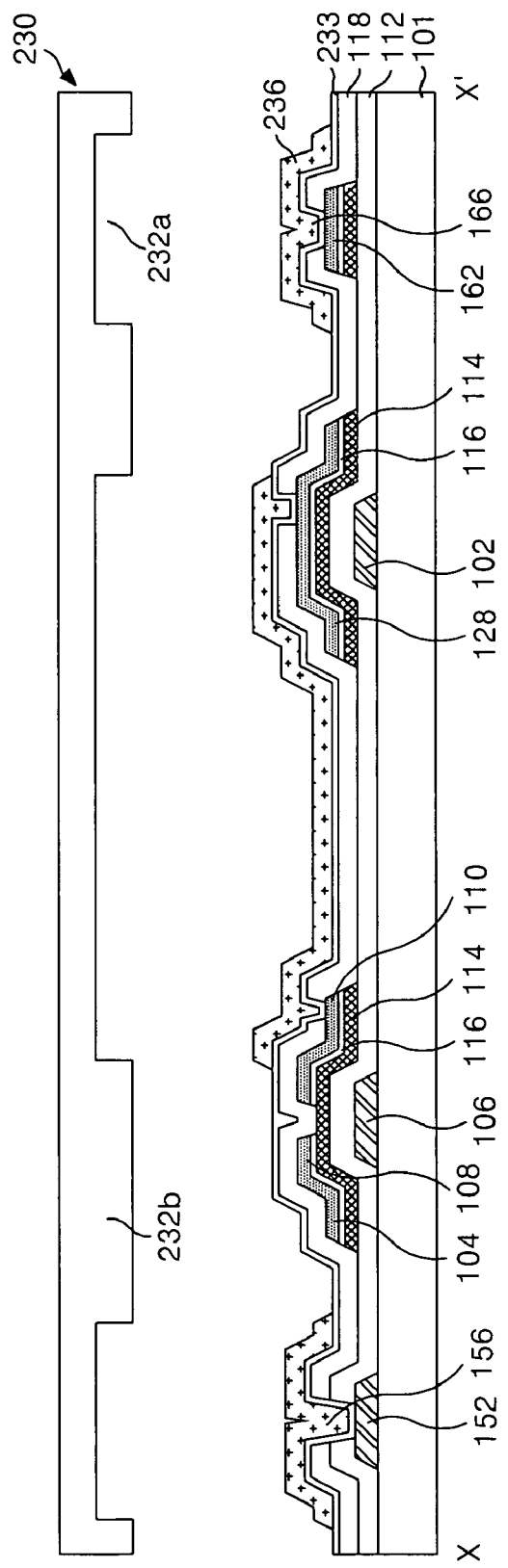

Subsequently, a fourth soft mold 230 having a groove 232a and a protrusion 232b is arranged on an upper portion of the etch resist solution 234. The groove 232a of the fourth soft mold 230 is corresponded to an area in which the third conductive pattern group will be formed. The etch resist solution 234 is pressurized by the fourth soft mold 230 with a load weight during a designated time, for example, about 10 minutes to 2 hours, by the first soft mold. At this time, the substrate 101 is baked at about or less than 130 ° C. Then, the etch resist solution 234 is moved into the groove 232a of the fourth soft mold 230 by a capillary force generated by a pressure between the fourth soft mold 230 and the substrate 101 and by a repulsive power generated between the fourth soft mold 230 and the etch resist solution 234. As a result, the groove 232a of the fourth soft mold 230 and an inversely transferred etch resist pattern 236 are formed as shown in FIG. 11B.

Figure 11C:
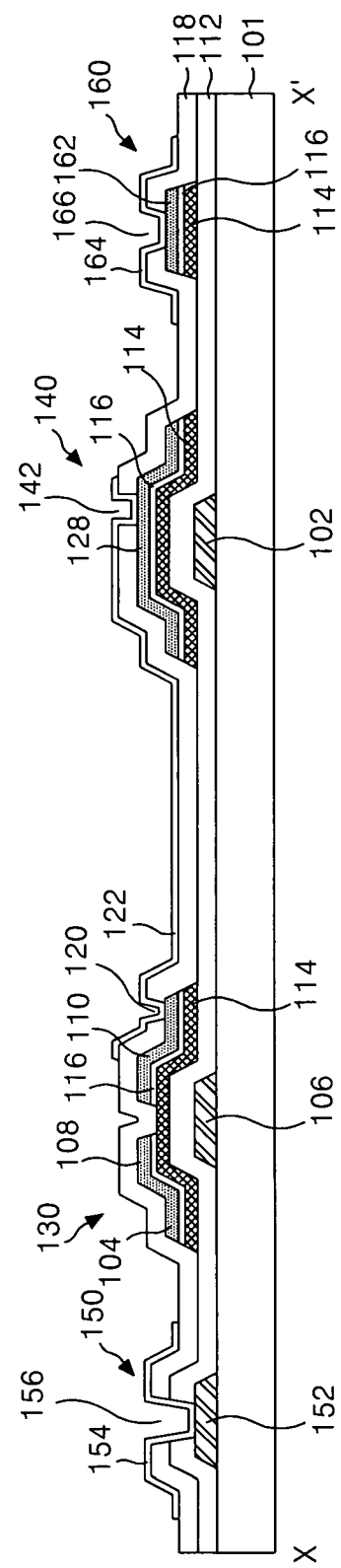

Thereafter, the fourth soft mold 230 is separated from the substrate 101, and then the transparent conductive film 233 is patterned by an etching process using the etch resist pattern 236 as a mask. Accordingly, a third conductive pattern group, including the pixel electrode 122, the upper gate pad electrode 154 and the upper data pad electrode 164, is formed as shown in FIG. 11C.

The pixel electrode 122 is electrically connected to the drain electrode 110 via the first contact hole 120 while being electrically connected to the storage electrode 128 via the second contact hole 142. The upper gate pad electrode 154 is electrically connected to the lower gate pad electrode 152 via the third contact hole 156. The upper data pad electrode 164 is electrically connected to the lower data pad electrode 162 via the fourth contact hole 166. In succession, a remainder of the etch resist pattern 236 left on the third conductive pattern group is removed by a stripping process using a striper liquid, preferably of an environmentally friendly alcohol system.

Each of the first to the fourth soft molds according to the present invention is separated from the substrate and, then, is cleaned through the use of ultraviolet UV and $O_3$. Each of the cleaned first to fourth soft molds is re-used for a patterning process of the other thin films.

Although the present invention of the method of the thin film transistor array substrate has been described the thin film transistor array substrate of a liquid crystal display device as an example, it can be applied to all of thin films formed by photolithography using a mask. For instance, thin films of an electro-luminescence device, a plasma display panel, a field emission display device, and a color filter array substrate included in a liquid crystal display device can be formed by a patterning process using an etch resist and a soft mold according to the present invention.

As described above, according to the present invention of the method of fabricating the thin film transistor array substrate, a thin film of the thin film transistor array substrate can be patterned using the soft mold and the etch resist without using a photo process. Accordingly, expensive exposure equipment is not needed, an overall fabricating process becomes more simple, and an accuracy for the fabricating process is enhanced. Thus, a processing time is reduced, production yield is improved, and cost is decreased.

It will be apparent to those skilled in the art that various modifications and variations can be made in the method of fabricating thin film transistor array substrate of the present invention without departing from the spirit or scope of the invention. Thus, it is intended that the present invention cover the modifications and variations of this invention provided they come within the scope of the appended claims and their equivalents.

What is claimed is:

1. A method of fabricating a thin film transistor array substrate, comprising:
    forming a first conductive pattern group on a substrate using a first etch resist and a first soft mold, the first conductive pattern group including a gate electrode and a gate line;
    forming a gate insulating film on the substrate and the first conductive pattern group;
    forming a second conductive pattern group and a semiconductor pattern on the gate insulating film using a second etch resist and a second soft mold, the second conductive pattern group including a source electrode, a drain electrode, and a data line, the semiconductor pattern defining a channel region between the source electrode and the drain electrode;
    forming a passivation film on the gate insulating film, the second conductive pattern group and the semiconductor pattern using a third etch resist and a third soft mold, the passivation film defining a contact hole therethrough; and
    forming a third conductive pattern group on the passivation film using a fourth etch resist and a fourth soft mold, the third conductive pattern group including a pixel electrode.

2. The method according to claim 1, wherein the step of forming the first conductive pattern group includes:
    forming a gate metal layer and the first etch resist on the substrate;
    pressurizing the first soft mold on the first etch resist and, simultaneously, heating the substrate to form a first etch resist pattern, wherein the first soft mold defines a groove corresponding to the first conductive pattern group;
    separating the first soft mold from the first etch resist pattern; and
    etching the gate metal layer using the first etch resist pattern as a mask.

3. The method according to claim 2, wherein the step of forming the first etch resist pattern includes applying a load weight of the first soft mold onto the first etch resist for about 10 minutes to 2 hours at a temperature about or less than 130° C. (degrees Celsius).

4. The method according to claim 2, further comprising removing the first etch resist pattern using a striper liquid of an alcohol system after the etching step.

5. The method according to claim 1, wherein the step of forming the second conductive pattern group and the semiconductor pattern includes:
sequentially forming a first semiconductor layer, a second semiconductor layer, a data metal layer, and the second etch resist;
pressurizing the second soft mold on the second etch resist and, simultaneously, heating the substrate to form a second etch resist pattern having a stepped portion, wherein the second soft mold has a first groove corresponding to the second conductive pattern group and the semiconductor pattern, and wherein the second soft mold has a second groove corresponding to the channel region, the second groove having a height different from that of the first groove;
separating the second soft mold from the second etch resist pattern;
wet-etching the data metal layer using the second etch resist pattern as a mask;
dry-etching the first and the second semiconductor layers using the second etch resist pattern as a mask;
ashing the second etch resist pattern; and
etching the data metal layer and the second semiconductor corresponding to the channel region using the ashed second etch resist pattern as a mask.

6. The method according to claim 5, wherein the step of forming the second etch resist pattern includes applying a load weight of the second soft mold onto the second etch resist for about 10 minutes to 2 hours at a temperature about or less than 130° C. (degrees Celsius).

7. The method according to claim 5, further comprising removing the second etch resist pattern using a striper liquid of an alcohol system after the etching step.

8. The method according to claim 1, wherein the step of forming the passivation film defining the contact hole includes:
forming a passivation film and the third etch resist on the gate insulating film having the second conductive pattern group including the semiconductor pattern thereon;
pressurizing the third soft mold on the third etch resist and, simultaneously, heating the substrate to form a third etch resist pattern, wherein the third soft mold has a protrusion corresponding to the contact hole;
separating the third soft mold from the third etch resist pattern; and
etching the passivation film using the third etch resist pattern as a mask.

9. The method according to claim 8, wherein the step of forming the third etch resist pattern includes applying a load weight of the third soft mold onto the third etch resist for about 10 minutes to 2 hours at a temperature about or less than 130° C. (degrees Celsius).

10. The method according to claim 8, further comprising removing the third etch resist pattern using a striper liquid of an alcohol system after the etching step.

11. The method according to claim 1, wherein the step of forming the third conductive pattern group having the pixel electrode includes:
forming a transparent conductive film and the fourth etch resist on the passivation film;
pressurizing the fourth soft mold on the fourth etch resist and, simultaneously, heating the substrate to form a fourth etch resist pattern, wherein the fourth soft mold has a groove corresponding to the third conductive pattern group;
separating the fourth soft mold from the fourth etch resist pattern; and
etching the transparent conductive film using the fourth etch resist pattern as a mask.

12. The method according to claim 11, wherein the step of forming the fourth etch resist pattern includes applying a load weight of the fourth soft mold onto the fourth etch resist for about 10 minutes to 2 hours at a temperature about or less than 130° C. (degrees Celsius).

13. The method according to claim 11, further comprising removing the fourth etch resist pattern using a striper liquid of an alcohol system after the etching step.

14. The method according to claim 1, wherein at least one of the first to the fourth etch resists includes an ethanol solution having a novolac resin of about 5 weight % to 30 weight % added thereto.

15. The method according to claim 1, wherein at least one of the first to the fourth soft molds includes one of a polydimethylsiloxane (PDMS), a polyurethane, and a cross-linked novolac resin.

16. A method of fabricating a thin film transistor array substrate, comprising:
forming at least one thin film of a conductive layer, a semiconductor layer, and an insulating layer on a substrate;
forming an etch resist on the at least one thin film;
pressure contacting a soft mold onto the etch resist and, simultaneously, heating the substrate to form an etch resist pattern;
separating the soft mold from the etch resist pattern; and
etching the thin film using the etch resist pattern as a mask to form at least one of a conductive pattern, a semiconductor pattern, and an insulating pattern.

17. The method according to claim 16, wherein the soft mold includes a groove corresponding to the etch resist pattern or a protrusion contacting with the etch resist to define a space.

18. The method according to claim 17, wherein the step of pressure contacting the soft mold onto the etch resist and, simultaneously, heating the substrate to form the etch resist pattern includes applying a load weight of the soft mold onto the etch resist for about 10 minutes to 2 hours at a temperature about or less than 130° C. (degrees Celsius) while the etch resist moves into the space defined by the soft mold.

19. The method according to claim 16, the etch resist includes an ethanol solution having a novolac resin of about 5 weight % to 30 weight % added thereto.

20. The method according to claim 16, wherein the soft mold includes one of a polydimethylsiloxane (PDMS), a polyurethane, and a cross-linked novolac resin.

21. The method according to claim 16, further comprising removing the etch resist pattern using a striper liquid of an alcohol system after the etching step.

22. The method according to claim 16, wherein the step of pressure contacting the soft mold onto the etch resist includes applying a load weight of the soft mold onto the etch resist.

23. The method according to claim 16, further comprising removing the etch resist pattern after the etching step.

24. The method according to claim 16, wherein, during the step of pressure contacting the soft mold onto the etch resist, the etch resist moves into a space defined in a surface of the soft mold.

* * * * *